United States Patent
Kirkpatrick

(10) Patent No.: US 8,798,189 B2
(45) Date of Patent: *Aug. 5, 2014

(54) DIGITAL VIDEO PHYSICAL LAYER USING A MULTI-LEVEL DATA CODE

(75) Inventor: Philip L. Kirkpatrick, Dumont, NJ (US)

(73) Assignee: Crestron Electronics Inc., Rockleigh, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/293,737

(22) Filed: Nov. 10, 2011

(65) Prior Publication Data

US 2012/0057642 A1 Mar. 8, 2012

Related U.S. Application Data

(63) Continuation of application No. 12/163,409, filed on Jun. 27, 2008, now Pat. No. 8,081,705.

(51) Int. Cl.
*H04L 25/49* (2006.01)
*H04B 3/00* (2006.01)

(52) U.S. Cl.
USPC ........... 375/288; 375/293; 375/286; 375/287; 375/257; 375/258; 327/52; 341/143

(58) Field of Classification Search
USPC ............... 375/356, 240; 370/528; 341/106
See application file for complete search history.

(56) References Cited

U.S. PATENT DOCUMENTS

| | | | | |
|---|---|---|---|---|
| 4,123,710 A | * | 10/1978 | Stuart et al. | 375/263 |
| 4,486,739 A | | 12/1984 | Franaszek | |
| 6,052,390 A | * | 4/2000 | Deliot et al. | 370/528 |
| 6,225,924 B1 | | 5/2001 | Epshtein | |
| 6,975,674 B1 | | 12/2005 | Phanse | |
| 7,359,437 B2 | * | 4/2008 | Hwang et al. | 375/240 |
| 2008/0187028 A1 | * | 8/2008 | Lida | 375/140 |
| 2010/0215118 A1 | * | 8/2010 | Ware et al. | 375/295 |
| 2010/0225620 A1 | * | 9/2010 | Lee | 345/204 |

* cited by examiner

*Primary Examiner* — Shuwang Liu
*Assistant Examiner* — Ross Varndell
(74) *Attorney, Agent, or Firm* — Crestron Electronics Inc.

(57) ABSTRACT

A system for communicating data comprises a clock channel configured to transmit a clock signal at a predetermined rate and at least one data channel configured to transmit data as a sequence of blocks of multi-level symbols being sent at a fixed multiple of the clock rate. Each block of multi-level symbols comprises a sequence of at least three multi-level symbols. Each multi-level symbol has an analog voltage level selected from a predetermined number of possible values, the predetermined number being an integer greater than two. The fixed multiple of the clock rate is an integer greater than one.

19 Claims, 6 Drawing Sheets

DIGITAL VIDEO PHYSICAL LAYER USING A MULTI-LEVEL DATA CODE

BACKGROUND OF THE INVENTION

1. Technical Field

This invention relates to apparatus and methods for communicating data, and more specifically communicating data over at least one channel, such as a cable having a plurality of conductors (for example, four twisted pairs of wires), and for encoding and/or decoding data in connection with such communications.

2. Background Art

FIG. 1 illustrates the prior art transition minimized differential signaling (TMDS) physical layer that was developed by Silicon Image Inc. as a member of the Digital Display Working Group and is used in both the well-known Digital Visual Interface (DVI) and High Definition Multimedia Interface (HDMI).

TMDS is a physical layer technology for transmitting high-speed serial data in a simplex mode from one transmitter to one receiver. A useful description of this TMDS interface is included in the background section of Hwang (U.S. Pat. No. 7,359,437). The TMDS transmitter incorporates a coding algorithm designed to minimize electromagnetic interference (EMI) over copper cables. The algorithm is a form of eight-bit binary to ten-bit binary (8B:10B) coding, similar to that described in Franaszek (U.S. Pat. No. 4,486,739) but using a different code-set that differs from the IBM originated form. Hwang describes yet another form of eight-bit binary to ten-bit binary (8B:10B) coding that may be more effective than the TMDS coding algorithm at reducing inter-symbol interference. Each TMDS ten-bit word can represent either an eight-bit data value, typically representing video pixel data, or alternatively a two-bit control value, typically used for horizontal and vertical sync during screen blanking. Such a TMDS coding algorithm can therefore be described as an eight-symbol, alternatively two-symbol, binary (base-two) to ten-symbol binary (base-two) coding algorithm and is represented herein in short hand form as '8/2B:10B'.

In the TMDS coding scheme, four hundred sixty (460) combinations, out of the possible one thousand twenty four (1024) combinations, for a 10-bit binary word, are used for representing an 8-bit data value. Some of the two hundred fifty six (256) possible values, of each 8-bit binary word, are encoded using a single variant and other values have two encoded variants. Four combinations, of the 10-bit binary output word, are used for representing a 2-bit control word used for TMDS control signals, such as horizontal and vertical sync video signals.

FIG. 1 depicts a typical TMDS interface configured to transmit red-green-blue (RGB) video data. TMDS uses four twisted wire pairs (120, 121, 122, and 123) to transmit a clock channel 130 and three data channels (131, 132, and 133). Red video data 131 is transmitted as a serial stream of ten, as described above, 2-level (binary) symbols per pixel into a first twisted pair 121 of wires at a rate of between 250 MHz and 3.4 GHz. Green video data 132 is transmitted as a serial stream of ten 2-level (binary) symbols per pixel into a second twisted pair 122 of wires at a rate of between 250 MHz and 3.4 GHz. Blue video data 133 is transmitted as a serial stream of ten 2-level (binary) symbols per pixel into a third twisted pair 123 of wires at a rate of between 250 MHz and 3.4 GHz. A pixel clock 100 transmits clock data 130 consisting of one 2-level (binary) symbol per pixel into a fourth twisted pair 120 of wires at a rate of between 25 MHz and 340 MHz, or one-tenth the symbol rate of the data channels.

TMDS uses direct current (DC)-coupled current mode logic (CML), terminated to 3.3 volts and DC balanced by the encoding algorithm. Each TMDS data channel includes an eight-symbol, alternatively two-symbol, binary (base-two) to ten-symbol binary (8/2/B:10B) encoder (11R, 11G, and 11B), a twisted wire pair (121, 122, and 123), and a ten-symbol binary to eight-symbol, alternatively two-symbol, binary decoder (17R, 17G, and 17B). The clock channel 130 is used for inter-channel alignment 101, such as between the three data channels (131, 132, and 133), at the receiving side of the interface. Typical TMDS data channels (131, 132, and 133) will also include pre-emphasis stages (12R, 12G, and 12B) and equalization stages (16R, 16G, and 16B).

In a different area of the prior art, communication systems have been developed which use more than two voltage levels to represent digital data. For example, a four-level pulse amplitude modulated system (PAM-4) will encodes two binary bits at a time and map the resulting signal amplitude to one of four possible voltage levels, such as −3 volts, −1 volt, 1 volt, and 3 volts. Demodulation is performed by detecting the amplitude level of the carrier at every symbol period. Each of these prior art systems transmits data in two-directions (full-duplex) and derives a clock signal from its data channels, rather than having a dedicated clock channel.

Phanse (U.S. Pat. No. 6,975,674) describes a PAM-5 (e.g. five voltage levels per symbol) interface that is suitable for transmitting 125 mega-symbols per second (125 MHz) per twisted wire pair on a four-pair Cat 5e cable resulting in an aggregate transmission of 500 mega-symbols per second (500 MHz) per direction in a full-duplex transmission configuration. According to Phanse, this allows for a (binary) data rate of one gigabit per second (1 Gbps). Phanse is not applicable as a replacement for TMDS because it does not have enough bandwidth for the highest video rates and because it relies on recovering the clock from the data stream, has a significant DC residual correction required, and requires echo cancellation circuitry due to the duplex nature of its anticipated communication path.

Deliot (U.S. Pat. No. 6,052,390) describes a PAM-9 (e.g. nine voltage levels per symbol) interface and is instructive in the need to manage DC residual when using multi-level signals in a transformer coupled system as well as the effect of overall energy from a multi-level symbol group in terms of resultant electromagnetic interference (EMI). However, Deloit requires that delimiters be inserted between multi-level symbol groups, which introduces a significant processing overhead that is not desirable when associated with high speed video data transfer.

There continues to be a long-felt need to extend the cabling length and/or bandwidth available for high-definition media interface (HDMI) television signals which is unanswered by the prior art.

SUMMARY OF THE INVENTION

The following summary of the invention is provided to facilitate an understanding of some of the innovative features unique to the present invention. A full appreciation of the various aspects of the invention can only be gained by taking the entire specification, claims, drawings, and abstract as a whole.

DISCLOSURE OF INVENTION

In accordance with the present invention, the present TMDS physical layer used in a Digital Visual Interface (DVI)

is replaced with a physical layer having multiple levels per symbol and a relatively low symbol clock rate.

According to a first aspect of the present disclosure, a system comprises a clock channel configured to transmit a clock signal at a predetermined rate. The system further includes at least one data channel configured to transmit data as a sequence of blocks of multi-level symbols being sent at a fixed multiple of the clock rate. Each block of multi-level symbols comprises a sequence of at least three multi-level symbols. Each multi-level symbol has an analog voltage level selected from a predetermined number of possible values, the predetermined number being an integer greater than two. The fixed multiple of the clock rate is an integer greater than one.

According to a second aspect of the present disclosure, a method comprises the steps of transmitting a clock signal at a predetermined rate and transmitting data as a sequence of blocks of multi-level symbols at a fixed multiple of the clock rate. Each block of multi-level symbols comprises a sequence of at least three multi-level symbols. Each multi-level symbol has an analog voltage level selected from a predetermined number of possible values, the predetermined number being an integer greater than two. The fixed multiple of the clock rate is an integer greater than one.

According to a third aspect of the present disclosure, a method comprises the steps of deriving a code block for each of a plurality of signals in accordance with a predetermined code by an encoder. The method further includes accepting the code block from the encoder and generating, as an output, a group of multi-level symbols corresponding thereto by a digital to analog converter. The method further includes transmitting the group of multi-level symbols over at least one data channel, accepting, as an input, the group of multilevel symbols and generating the code block corresponding thereto by an analog to digital converter, and accepting the code block from the analog to digital converter and deriving each of the plurality of signals from the code block in accordance with the predetermined code by a decoder.

According to a fourth aspect of the present disclosure, a method for transmitting data and control signals comprises encoding an eight symbol, alternatively two symbol, binary input data set and producing therefrom a three symbol undenary output data set. The binary input data set comprises a first binary word having two data bits, a second binary word having eight data bits, and a control bit indicating which one of the first and second binary word determines a resultant code. The method further includes decoding a three symbol undenary input data set and producing therefrom an eight symbol, alternatively two symbol, binary output data set. The binary output set comprises a first binary word having two data bits, a second binary word having eight data bits, and a control bit indicating which one of the first and second binary word was determined from the undenary input data set.

According to a fifth aspect of the present disclosure, a method for transmitting data and control signals on twisted wire pairs comprises providing a clock channel operating at a predetermined rate and transmitting a clock signal on a first one of the twisted wire pairs. The method further comprises providing at least one data channel, each operating at a same fixed multiple of the clock rate. Each of the at least one data channel includes an encoder performing the steps of: (a) accepting, as an input set, a TMDS "Data Enable" signal, two TMDS control signals, "[C1:C0]", and eight TMDS data signals, "[D7:D0]", (b) producing, as an output set, a first sequence of three undenary symbols, and (c) computing a running digital sum of the undenary symbols of the first sequence. Each of the at least one data channel also includes (a) a digital to analog converter for accepting the first sequence of three undenary symbols and producing therefrom an output varying level analog voltage in synchronization with the clock channel, (b) a pre-emphasis stage for conditioning and transmitting the varying level analog voltage onto a corresponding further one of the twisted wire pairs, (c) an equalization stage for receiving and conditioning the varying level analog voltage from the corresponding further one of the twisted wire pairs, and (d) an analog to digital converter for accepting the varying level analog voltage and producing therefrom a second sequence of three undenary symbols in synchronization with the clock channel. Each of the at least one data channel further includes a decoder performing the steps of (a) accepting, as an input set, the second sequence of three undenary symbols, and (b) producing, as an output set, a TMDS "Data Enable" signal, two TMDS control signals, "[C1:C0]", and eight TMDS data signals, "[D7:D0]".

The present invention seeks to overcome or at least ameliorate one or more of several problems, including but not limited to: extending the range available for high definition television cabling.

BRIEF DESCRIPTION OF DRAWINGS

The accompanying figures further illustrate the present invention.

Figure 1:
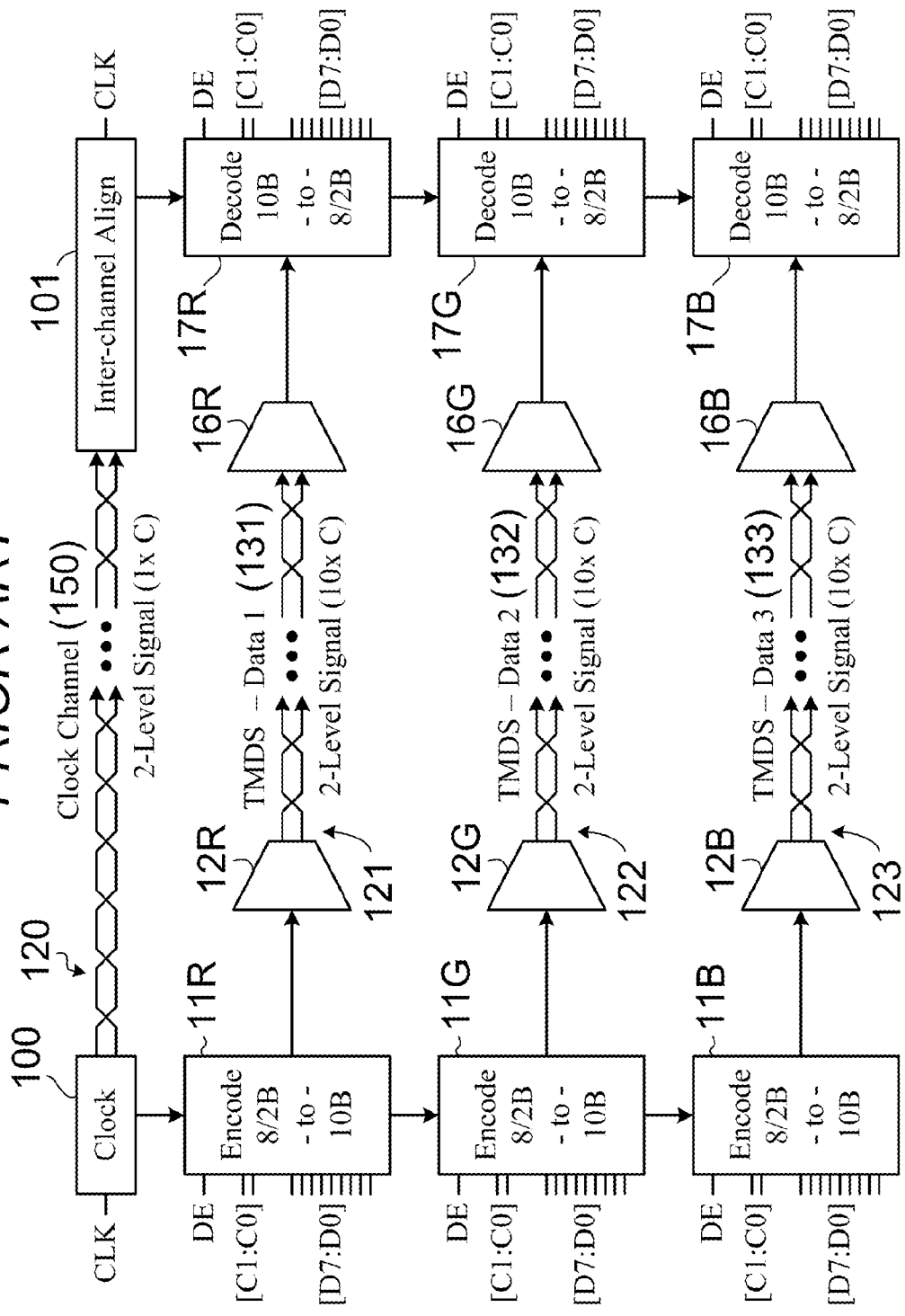

Brief Description of the Several Views of the Drawing

FIG. 1 shows a TMDS physical layer as is known in the prior art.

Figure 2:
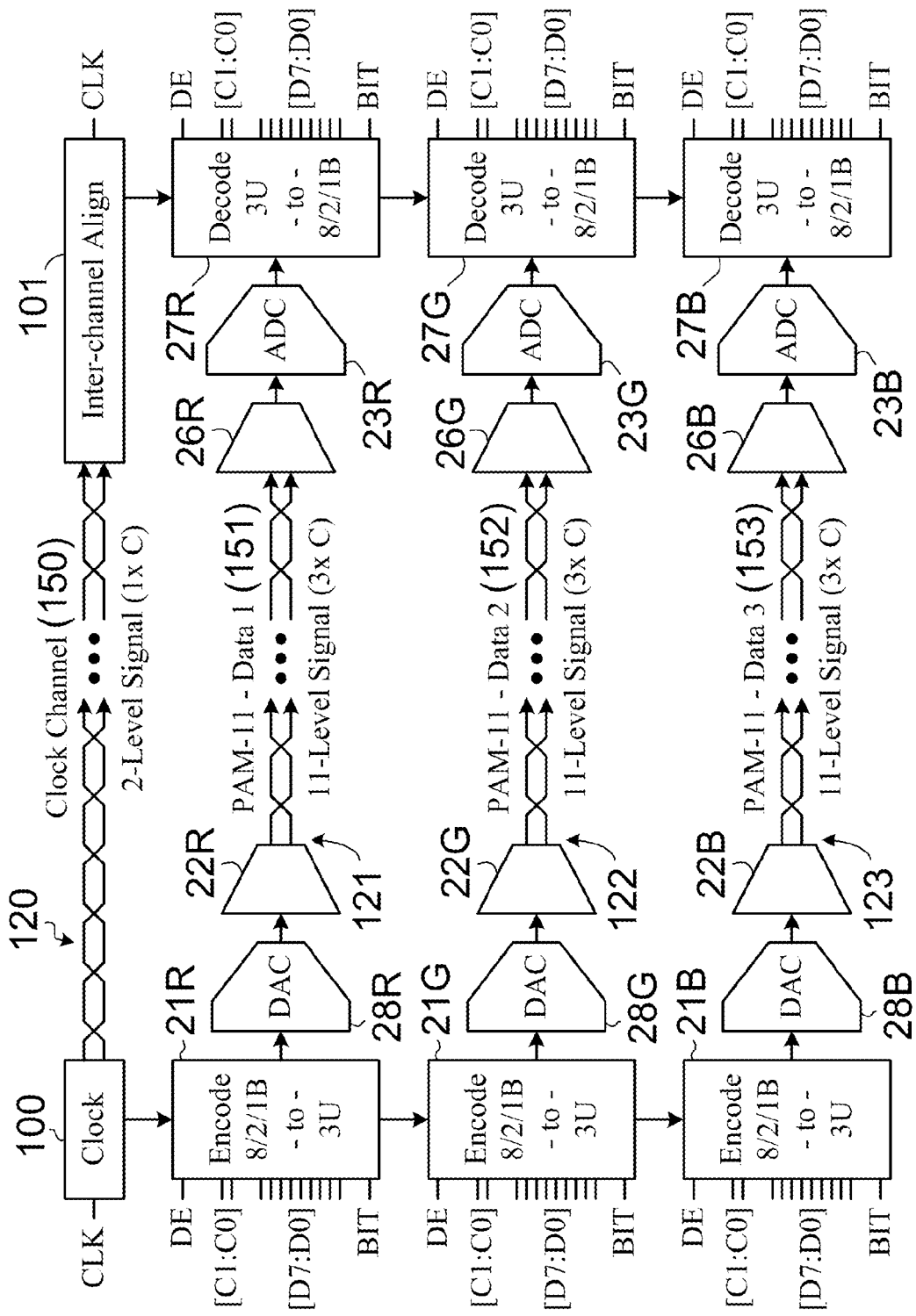

FIG. 2 shows a physical layer is accordance with the present invention.

Figure 3:
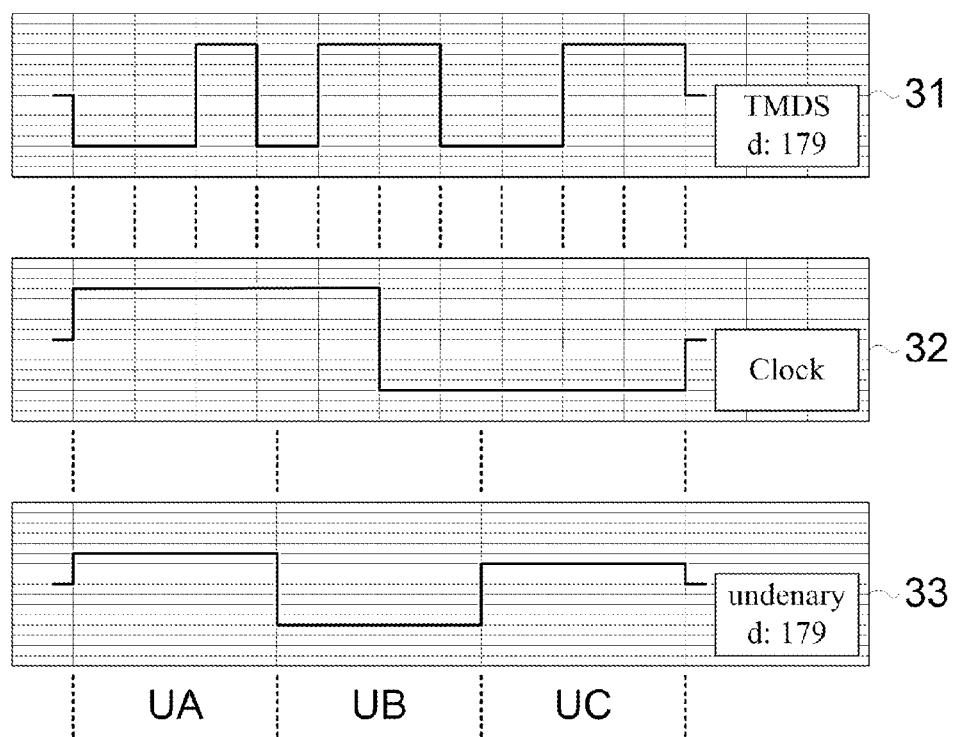

FIG. 3 is a timing comparison between the physical layer of the prior art and the present invention.

Figure 4:
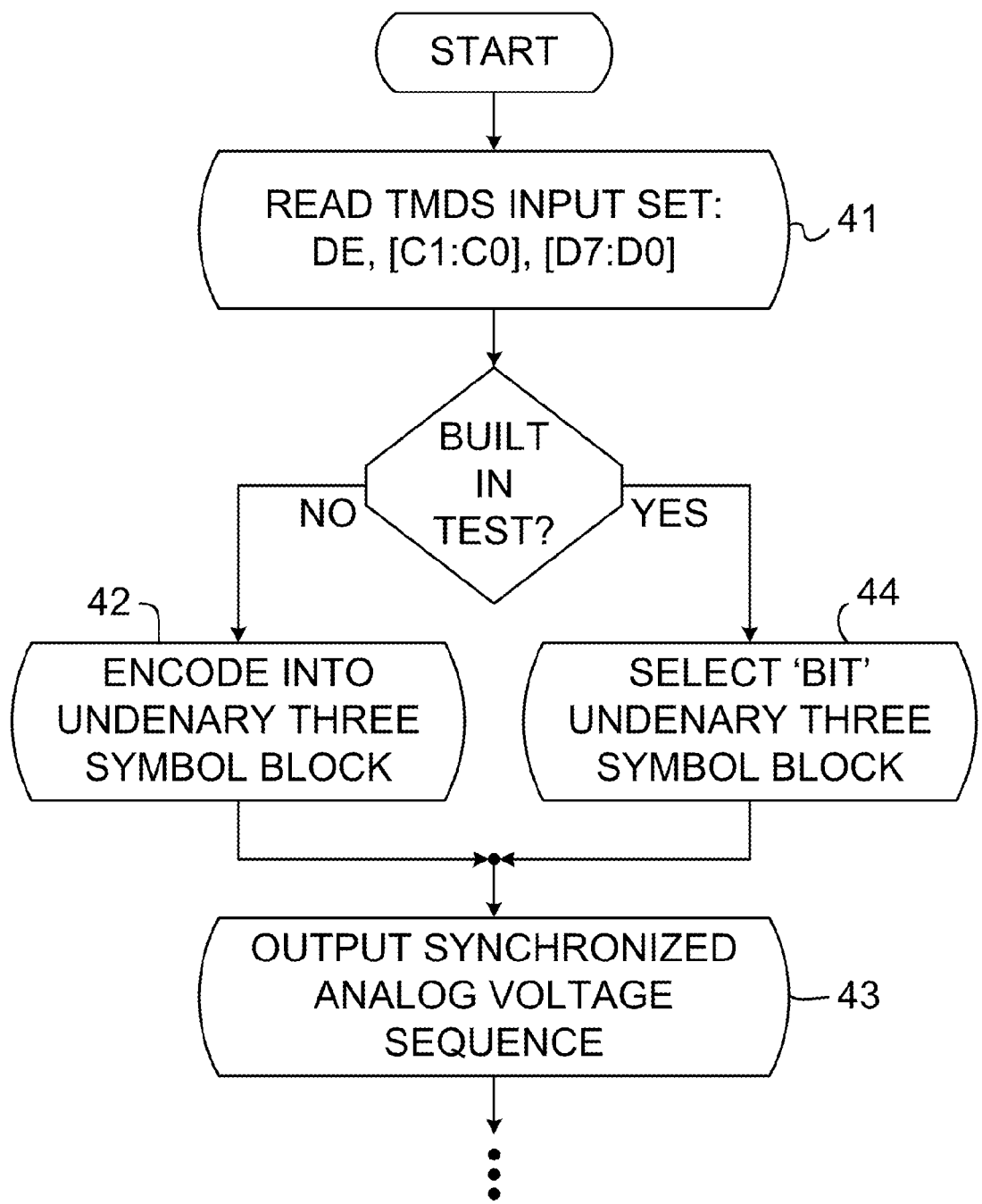

FIG. 4 depicts the encoding of signals typically present at a TMDS interface using a new inventive encoding method in accordance with one illustrative embodiment of the present invention.

Figure 5:
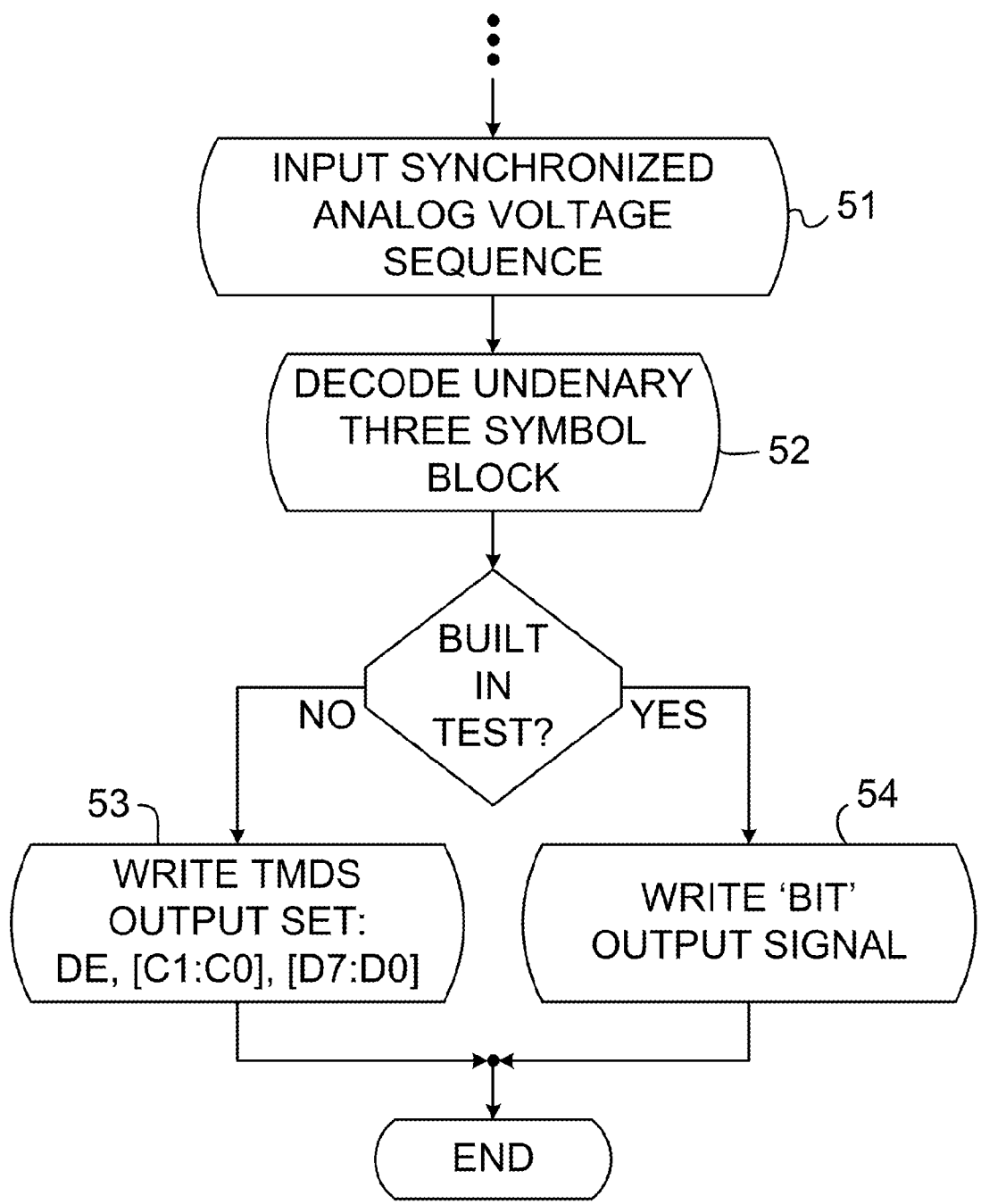

FIG. 5 depicts the decoding of signals encoded by the method of FIG. 4 into signals that are typically present at a TMDS interface in accordance with one illustrative embodiment of the present invention.

Figure 6:
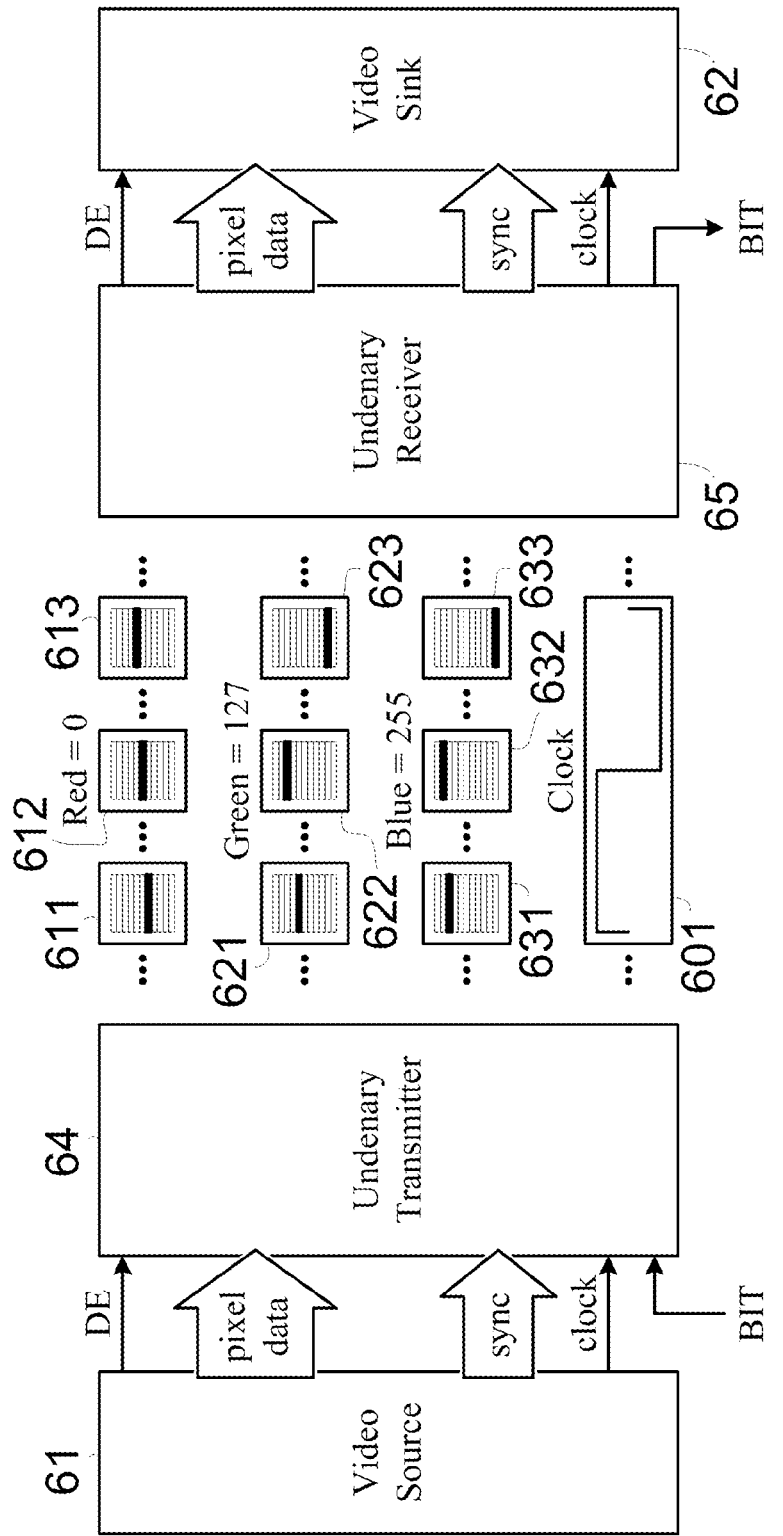

FIG. 6 depicts a digital video interface in accordance with an illustrative embodiment of the present invention.

LIST OF REFERENCE NUMBERS FOR THE MAJOR ELEMENTS IN THE DRAWINGS

The following is a list of the major elements in the drawings in numerical order.
  11R 8/2B:10B encoder (TMDS) (red channel)
  11G 8/2B:10B encoder (TMDS) (green channel)
  11B 8/2B:10B encoder (TMDS) (blue channel)
  12R pre-emphasis stage (red channel)
  12G pre-emphasis stage (green channel)
  12B pre-emphasis stage (blue channel)
  16R equalization stage (red channel)
  16G equalization stage (green channel)
  16B equalization stage (blue channel)
  17R 10B:8/2B decoder (TMDS) (red channel)
  17G 10B:8/2B decoder (TMDS) (green channel)
  17B 10B:8/2B decoder (TMDS) (blue channel)
  21R 8/2/1B:3U encoder (PAM-11) (red channel)
  21G 8/2/1B:3U encoder (PAM-11) (green channel)
  21B 8/2/1B:3U encoder (PAM-11) (blue channel)
  22R pre-emphasis stage (red channel)

22G pre-emphasis stage (green channel)
22B pre-emphasis stage (blue channel)
23R analog to digital converter (ADC) (red channel)
23G analog to digital converter (ADC) (green channel)
23B analog to digital converter (ADC) (blue channel)
26R equalization stage (red channel)
26G equalization stage (green channel)
26B equalization stage (blue channel)
27R 3U:8/2/1B decoder (red channel)
27G 3U:8/2/1B decoder (green channel)
27B 3U:8/2/1B decoder (blue channel)
28R digital to analog converter (DAC) (red channel)
28G digital to analog converter (DAC) (green channel)
28B digital to analog converter (DAC) (blue channel)
31 TMDS data waveform (encoded data value 179)
32 clock waveform (pixel clock)
33 undenary data waveform (encoded data value 179)
41 (step of) reading TMDS input set
42 (step of) encoding TMDS input set into undenary three symbol block
43 (step of) outputting synchronized analog voltage sequence
44 (step of) selecting undenary three symbol block for BIT signal
51 (step of) inputting synchronized analog voltage sequence
52 (step of) decoding TMDS undenary three symbol block
53 (step of) writing TMDS output set
54 (step of) writing BIT output signal
61 video source
62 video sink
64 undenary transmitter
65 undenary receiver
100 pixel clock
101 inter-channel alignment stage
120 fourth twisted pair of wires (clock channel)
121 first twisted pair of wires (data channel 1—red)
122 second twisted pair of wires (data channel 2—green)
123 third twisted pair of wires (data channel 3—blue)
131 TMDS data channel 1 (red)
132 TMDS data channel 2 (green)
133 TMDS data channel 3 (blue)
150 clock channel
151 PAM-11 data channel 1 (red)
152 PAM-11 data channel 2 (green)
153 PAM-11 data channel 3 (blue)
601 pixel clock signal
611 first red-value multilevel symbol ($R_{UA}$)
612 second red-value multilevel symbol ($R_{UB}$)
613 third red-value multilevel symbol ($R_{UC}$)
621 first green-value multilevel symbol ($G_{UA}$)
622 second green-value multilevel symbol ($G_{UB}$)
623 third green-value multilevel symbol ($G_{UC}$)
631 first blue-value multilevel symbol ($B_{UA}$)
632 second blue-value multilevel symbol ($B_{UB}$)
633 third blue-value multilevel symbol ($B_{UC}$)

DETAILED DESCRIPTION OF THE INVENTION

The present invention is a digital interface physical layer suitable for use in high-speed digital communications.

Unless the context clearly requires otherwise, throughout the description and the claims, the words 'comprise', 'comprising', and the like are to be construed in an inclusive sense as opposed to an exclusive or exhaustive sense; that is to say, in the sense of 'including, but not limited to'.

Mode(s) for Carrying Out the Invention

The preferred embodiment of the present invention is described herein in the context of an interface circuit and cabling that replaces the Transition Minimized Differential Signaling (TMDS) physical layer used in both the Digital Visual Interface (DVI) and High Definition Multimedia Interface (HDMI), which are widely used in consumer electronics.

Refer now to FIG. 2 and continue to refer to FIG. 1. One embodiment of the present invention is a 'pin-compatible' replacement for the well-known TMDS interfaces. For example, both the commercially available TMDS physical layer and the physical layer of the present invention are typically connected by four sets of unshielded twisted pairs (UTP), but not limited to such a connection.

Table 1, below, compares the TMDS physical layer known in the prior art with the undenary (base-11) physical layer, referred to as eleven-level pulse amplitude modulation (PAM-11), of the present invention.

TABLE 1

| Characteristic | TMDS | Present Invention (PAM-11) |
|---|---|---|
| Cable: | Special/Proprietary; Four (4) unshielded twisted wire pairs | Standard Cat-5e; Four (4) unshielded twisted wire pairs |
| Coupling: | DC (current mode) | AC (transformer) |
| Transmission Mode: | Simplex (one direction only); Point-to-Point only | Simplex (one direction only); Point-to-Point or Point-to-Multipoint. |
| Maximum Video Bandwidth | 8.16 Gbit/s | 8.16 Gbit/s |
| Maximum Audio Bandwidth | 36.86 Mbit/s | 36.86 Mbit/s |
| Maximum Resolution over Single Link at 24 bit/pixel | 2560 × 1600p75 | 2560 × 1600p75 |
| Pixel Clock: | 25 MHz to 340 MHz | 25 MHz to 340 MHz |
| Symbol Clock: | 75 MHz to 3.40 GHz | 75 MHz to 1.02 GHz |
| Symbol Encoding: | 8/2B: 10B | 8/2/1B: 3U |
| Valid Symbols: | 460 of 1024 possible | 432 of 1331 possible |
| Symbol Encoding: | 8/2B: 10B | 8/2/1B: 3U |

The three data channels (151, 152, and 153) shown in FIG. 2 are similar to one another. The discussion that follows addresses a single data channel 151, such as 'Data 1', that may be used, for example, to carry red video information.

At the transmitting end of the (red video) interface, signals normally present at a TMDS (red video) interface, the TMDS input set, consisting of a 'data enable' (DE) signal, two control bits [C1:C0], eight data bits [D7:D0], are fed into an eight-symbol, alternatively two-symbol, and alternatively one-symbol binary (base-two) to three-symbol undenary (base-eleven) (8/2/1B:3U) encoder 21R. In addition, a special built-in-test (BIT) signal is also fed into the 8/2/1B:3U encoder 21R. According to the present invention, there is a similar green video 8/2/1B:3U encoder 21G and a similar blue video 8/2/1 B:3U encoder 21B.

The two control bits can be considered as a first binary word (i.e. of two-bit length) and the eight data bits can be considered as a second binary word (i.e. of eight-bit length). The TMDS 'data enable' (DE) signal is used as a control bit that indicates which one of the first and second binary words determines the encoding result.

When the TMDS 'data enable' (DE) signal is not set (e.g. logic '0'), the encoder 21R uses the value of the two control bits [C1:C0] to determine an output symbol triplet. When the TMDS 'data enable' (DE) signal is set (e.g. logic '1'), the encoder 21R uses the value of the eight data bits [D7:D0] to determine the output symbol triplet. When the BIT signal is set (e.g. logic '1'), the encoder 21R outputs the special BIT symbol triplet.

In a preferred embodiment, the 8/2/1B:3U encoder 21R translates the TMDS input set into a corresponding block of three multi-level symbols (e.g. symbol triplet) in accordance with a 8/2/1B:3U block code, such as shown in Table 2 herein, where each symbol can have any one of eleven possible values. In other embodiments the symbol blocks can consist of other than three symbols and each multi-level symbol can have other than eleven values.

The eleven possible symbol values will be represented on the first data channel 151 by eleven different voltage levels, measured between the two wires of the first twisted pair 121, one level being zero, five being positive voltage levels, and five being negative voltage levels. For convenience, these symbols and the corresponding voltage levels are referenced herein by the arbitrary numerical values −5, −4, −3, −2, −1, 0, +1, +2, +3, +4, and +5; the actual voltages may be numerically different from these values, and may be chosen to satisfy practical requirements involving, for example, power dissipation and noise margins. In a further embodiment of the present invention, the voltage levels are dynamically adjusted for a particular installation, such as one using existing Cat-5e cabling. In a similar manner, the second data channel 152 uses the second twisted pair of wires 122 and the third data channel 153 uses the third twisted pair of wires 123.

In one embodiment of the present invention, the actual output of the 8/2/1B:3U encoder 21R is a sequence of four-bit words or nibbles, each nibble having one of eleven possible values (e.g. 0000, 0001, 0010, 0011, 0100, 0101, 0110, 0111, 1000, 1001, and 1010) representing the eleven possible undenary symbols, and successive triplets of nibbles defining the three symbols comprising the symbol triplet for the corresponding data/control/BIT word supplied to the encoder 21R. This sequence of four-bit nibbles produced by the encoder 21R is fed to a digital to analog converter (DAC) 28R, which produces a respective voltage level for each different symbol value and applies this voltage level to the twisted wire pair 121. Alternatively, further processing of the output of the DAC 28R, for example analog filtering, is allowed before it is applied to the twisted wire pair. For example, some embodiments include a pre-emphasis stage 22R.

The receiving end of the (red video) interface receives these voltage levels as inputs to an equalizer 26R, which compensates for the effects of different conductor lengths on distortion affecting the received signals. The compensated signal produced by the equalizer 26R is supplied to an analog to digital converter (ADC) 23R, which generates one of the eleven possible nibble values 0000 to 1010 corresponding to the voltage level closest to that present at the output of the equalizer 26R for each successive symbol period, such as an a rate of three symbols per pixel clock 100. In some embodiments a 16-level ADC with a 4-bit output is used to produce the nibbles. In other embodiments, higher resolution analog to digital converters are used where the outputs are then mapped to one of the eleven possible values.

The sequence of nibbles generated by the ADC 23R is passed to a 3U:8/2/1B decoder 27R which checks that the received encoded symbols are valid, and reverses the encoding performed by the encoder 21R. This decoder 27R also recognizes the special BIT sequence, which advantageously can be used to synchronize all three data channels with the clock channel. Advantageously, the BIT signal can be used to synchronize the decoders (27R, 27G, and 27B), within each data channel, with the pixel clock 100 by inter-channel alignment module 101.

An example of an 8/2/1B:3U code implemented in each of the encoders (21R, 21G, and 21B) is shown in Table 2 below.

TABLE 2

| Value | Symbol Block | | | Energy | Weight |
|---|---|---|---|---|---|
| | UA | UB | UC | | |
| data_000 | −1 | 0 | 1 | 2 | 0 |
| data_001 | −1 | 1 | 0 | 2 | 0 |
| data_002 | 0 | −1 | 1 | 2 | 0 |
| data_003 | 0 | 1 | −1 | 2 | 0 |
| data_004 | 1 | −1 | 0 | 2 | 0 |
| data_005 | 1 | 0 | −1 | 2 | 0 |
| data_006 | 0 | 0 | 2 | 2 | 2 |
| data_007 | 0 | 2 | 0 | 2 | 2 |
| data_008 | −1 | 0 | 2 | 3 | 1 |
| data_009 | −1 | 1 | 1 | 3 | 1 |
| data_010 | −1 | 2 | 0 | 3 | 1 |
| data_011 | 0 | −1 | 2 | 3 | 1 |
| data_012 | 0 | 2 | −1 | 3 | 1 |
| data_013 | 1 | −1 | 1 | 3 | 1 |
| data_014 | 1 | 1 | −1 | 3 | 1 |
| data_015 | 2 | −1 | 0 | 3 | 1 |
| data_016 | 2 | 0 | −1 | 3 | 1 |
| data_017 | −2 | 0 | 2 | 4 | 0 |
| data_018 | −2 | 1 | 1 | 4 | 0 |
| data_019 | −2 | 2 | 0 | 4 | 0 |
| data_020 | −1 | −1 | 2 | 4 | 0 |
| data_021 | −1 | 2 | −1 | 4 | 0 |
| data_022 | 0 | −2 | 2 | 4 | 0 |
| data_023 | 0 | 2 | −2 | 4 | 0 |
| data_024 | 1 | −2 | 1 | 4 | 0 |
| data_025 | 1 | 1 | −2 | 4 | 0 |
| data_026 | 2 | −2 | 0 | 4 | 0 |
| data_027 | 2 | −1 | −1 | 4 | 0 |
| data_028 | 2 | 0 | −2 | 4 | 0 |
| data_029 | −1 | 0 | 3 | 4 | 2 |
| data_030 | −1 | 1 | 2 | 4 | 2 |
| data_031 | −1 | 2 | 1 | 4 | 2 |
| data_032 | −1 | 3 | 0 | 4 | 2 |
| data_033 | 0 | −1 | 3 | 4 | 2 |
| data_034 | 0 | 3 | −1 | 4 | 2 |
| data_035 | 1 | −1 | 2 | 4 | 2 |
| data_036 | 1 | 2 | −1 | 4 | 2 |
| data_037 | 2 | −1 | 1 | 4 | 2 |
| data_038 | 2 | 1 | −1 | 4 | 2 |
| data_039 | 3 | −1 | 0 | 4 | 2 |
| data_040 | 3 | 0 | −1 | 4 | 2 |
| data_041 | −2 | 0 | 3 | 5 | 1 |
| data_042 | −2 | 1 | 2 | 5 | 1 |
| data_043 | −2 | 2 | 1 | 5 | 1 |
| data_044 | −2 | 3 | 0 | 5 | 1 |
| data_045 | −1 | −1 | 3 | 5 | 1 |
| data_046 | −1 | 3 | −1 | 5 | 1 |
| data_047 | 0 | −2 | 3 | 5 | 1 |
| data_048 | 0 | 3 | −2 | 5 | 1 |
| data_049 | 1 | −2 | 2 | 5 | 1 |
| data_050 | 1 | 2 | −2 | 5 | 1 |
| data_051 | 2 | −2 | 1 | 5 | 1 |
| data_052 | 2 | 1 | −2 | 5 | 1 |
| data_053 | 3 | −2 | 0 | 5 | 1 |
| data_054 | 3 | −1 | −1 | 5 | 1 |
| data_055 | 3 | 0 | −2 | 5 | 1 |
| data_056 | −3 | 0 | 3 | 6 | 0 |
| data_057 | −3 | 1 | 2 | 6 | 0 |
| data_058 | −3 | 2 | 1 | 6 | 0 |
| data_059 | −3 | 3 | 0 | 6 | 0 |
| data_060 | −2 | −1 | 3 | 6 | 0 |
| data_061 | −2 | 3 | −1 | 6 | 0 |
| data_062 | −1 | −2 | 3 | 6 | 0 |
| data_063 | −1 | 3 | −2 | 6 | 0 |
| data_064 | 0 | −3 | 3 | 6 | 0 |
| data_065 | 0 | 3 | −3 | 6 | 0 |
| data_066 | 1 | −3 | 2 | 6 | 0 |
| data_067 | 1 | 2 | −3 | 6 | 0 |

TABLE 2-continued

| | Symbol Block | | | | |
|---|---|---|---|---|---|
| Value | UA | UB | UC | Energy | Weight |
| data_068 | 2 | −3 | 1 | 6 | 0 |
| data_069 | 2 | 1 | −3 | 6 | 0 |
| data_070 | 3 | −3 | 0 | 6 | 0 |
| data_071 | 3 | −2 | −1 | 6 | 0 |
| data_072 | 3 | −1 | −2 | 6 | 0 |
| data_073 | 3 | 0 | −3 | 6 | 0 |
| data_074 | −2 | 0 | 4 | 6 | 2 |
| data_075 | −2 | 1 | 3 | 6 | 2 |
| data_076 | −2 | 2 | 2 | 6 | 2 |
| data_077 | −2 | 3 | 1 | 6 | 2 |
| data_078 | −2 | 4 | 0 | 6 | 2 |
| data_079 | −1 | −1 | 4 | 6 | 2 |
| data_080 | −1 | 4 | −1 | 6 | 2 |
| data_081 | 0 | −2 | 4 | 6 | 2 |
| data_082 | 0 | 4 | −2 | 6 | 2 |
| data_083 | 1 | −2 | 3 | 6 | 2 |
| data_084 | 1 | 3 | −2 | 6 | 2 |
| data_085 | 2 | −2 | 2 | 6 | 2 |
| data_086 | 2 | 2 | −2 | 6 | 2 |
| data_087 | 3 | −2 | 1 | 6 | 2 |
| data_088 | 3 | 1 | −2 | 6 | 2 |
| data_089 | 4 | −2 | 0 | 6 | 2 |
| data_090 | 4 | −1 | −1 | 6 | 2 |
| data_091 | 4 | 0 | −2 | 6 | 2 |
| data_092 | −3 | 0 | 4 | 7 | 1 |
| data_093 | −3 | 1 | 3 | 7 | 1 |
| data_094 | −3 | 2 | 2 | 7 | 1 |
| data_095 | −3 | 3 | 1 | 7 | 1 |
| data_096 | −3 | 4 | 0 | 7 | 1 |
| data_097 | −2 | −1 | 4 | 7 | 1 |
| data_098 | −2 | 4 | −1 | 7 | 1 |
| data_099 | −1 | −2 | 4 | 7 | 1 |
| data_100 | −1 | 4 | −2 | 7 | 1 |
| data_101 | 0 | −3 | 4 | 7 | 1 |
| data_102 | 0 | 4 | −3 | 7 | 1 |
| data_103 | 1 | −3 | 3 | 7 | 1 |
| data_104 | 1 | 3 | −3 | 7 | 1 |
| data_105 | 2 | −3 | 2 | 7 | 1 |
| data_106 | 2 | 2 | −3 | 7 | 1 |
| data_107 | 3 | −3 | 1 | 7 | 1 |
| data_108 | 3 | 1 | −3 | 7 | 1 |
| data_109 | 4 | −3 | 0 | 7 | 1 |
| data_110 | 4 | −2 | −1 | 7 | 1 |
| data_111 | 4 | −1 | −2 | 7 | 1 |
| data_112 | 4 | 0 | −3 | 7 | 1 |
| data_113 | −4 | 0 | 4 | 8 | 0 |
| data_114 | −4 | 1 | 3 | 8 | 0 |
| data_115 | −4 | 2 | 2 | 8 | 0 |
| data_116 | −4 | 3 | 1 | 8 | 0 |
| data_117 | −4 | 4 | 0 | 8 | 0 |
| data_118 | −3 | −1 | 4 | 8 | 0 |
| data_119 | −3 | 4 | −1 | 8 | 0 |
| data_120 | −2 | −2 | 4 | 8 | 0 |
| data_121 | −2 | 4 | −2 | 8 | 0 |
| data_122 | −1 | −3 | 4 | 8 | 0 |
| data_123 | −1 | 4 | −3 | 8 | 0 |
| data_124 | 0 | −4 | 4 | 8 | 0 |
| data_125 | 0 | 4 | −4 | 8 | 0 |
| data_126 | 1 | −4 | 3 | 8 | 0 |
| data_127 | 1 | 3 | −4 | 8 | 0 |
| data_128 | 2 | −4 | 2 | 8 | 0 |
| data_129 | 2 | 2 | −4 | 8 | 0 |
| data_130 | 3 | −4 | 1 | 8 | 0 |
| data_131 | 3 | 1 | −4 | 8 | 0 |
| data_132 | 4 | −4 | 0 | 8 | 0 |
| data_133 | 4 | −3 | −1 | 8 | 0 |
| data_134 | 4 | −2 | −2 | 8 | 0 |
| data_135 | 4 | −1 | −3 | 8 | 0 |
| data_136 | 4 | 0 | −4 | 8 | 0 |
| data_137 | −3 | 0 | 5 | 8 | 2 |
| data_138 | −3 | 1 | 4 | 8 | 2 |
| data_139 | −3 | 2 | 3 | 8 | 2 |
| data_140 | −3 | 3 | 2 | 8 | 2 |
| data_141 | −3 | 4 | 1 | 8 | 2 |
| data_142 | −3 | 5 | 0 | 8 | 2 |
| data_143 | −2 | −1 | 5 | 8 | 2 |
| data_144 | −2 | 5 | −1 | 8 | 2 |
| data_145 | −1 | −2 | 5 | 8 | 2 |
| data_146 | −1 | 5 | −2 | 8 | 2 |
| data_147 | 0 | −3 | 5 | 8 | 2 |
| data_148 | 0 | 5 | −3 | 8 | 2 |
| data_149 | 1 | −3 | 4 | 8 | 2 |
| data_150 | 1 | 4 | −3 | 8 | 2 |
| data_151 | 2 | −3 | 3 | 8 | 2 |
| data_152 | 2 | 3 | −3 | 8 | 2 |
| data_153 | 3 | −3 | 2 | 8 | 2 |
| data_154 | 3 | 2 | −3 | 8 | 2 |
| data_155 | 4 | −3 | 1 | 8 | 2 |
| data_156 | 4 | 1 | −3 | 8 | 2 |
| data_157 | 5 | −3 | 0 | 8 | 2 |
| data_158 | 5 | −2 | −1 | 8 | 2 |
| data_159 | 5 | −1 | −2 | 8 | 2 |
| data_160 | 5 | 0 | −3 | 8 | 2 |
| data_161 | −4 | 0 | 5 | 9 | 1 |
| data_162 | −4 | 1 | 4 | 9 | 1 |
| data_163 | −4 | 2 | 3 | 9 | 1 |
| data_164 | −4 | 3 | 2 | 9 | 1 |
| data_165 | −4 | 4 | 1 | 9 | 1 |
| data_166 | −4 | 5 | 0 | 9 | 1 |
| data_167 | −3 | −1 | 5 | 9 | 1 |
| data_168 | −3 | 5 | −1 | 9 | 1 |
| data_169 | −2 | −2 | 5 | 9 | 1 |
| data_170 | −2 | 5 | −2 | 9 | 1 |
| data_171 | −1 | −3 | 5 | 9 | 1 |
| data_172 | −1 | 5 | −3 | 9 | 1 |
| data_173 | 0 | −4 | 5 | 9 | 1 |
| data_174 | 0 | 5 | −4 | 9 | 1 |
| data_175 | 1 | −4 | 4 | 9 | 1 |
| data_176 | 1 | 4 | −4 | 9 | 1 |
| data_177 | 2 | −4 | 3 | 9 | 1 |
| data_178 | 2 | 3 | −4 | 9 | 1 |
| data_179 | 3 | −4 | 2 | 9 | 1 |
| data_180 | 3 | 2 | −4 | 9 | 1 |
| data_181 | 4 | −4 | 1 | 9 | 1 |
| data_182 | 4 | 1 | −4 | 9 | 1 |
| data_183 | 5 | −4 | 0 | 9 | 1 |
| data_184 | 5 | −3 | −1 | 9 | 1 |
| data_185 | 5 | −2 | −2 | 9 | 1 |
| data_186 | 5 | −1 | −3 | 9 | 1 |
| data_187 | 5 | 0 | −4 | 9 | 1 |
| data_188 | −5 | 0 | 5 | 10 | 0 |
| data_189 | −5 | 1 | 4 | 10 | 0 |
| data_190 | −5 | 2 | 3 | 10 | 0 |
| data_191 | −5 | 3 | 2 | 10 | 0 |
| data_192 | −5 | 4 | 1 | 10 | 0 |
| data_193 | −5 | 5 | 0 | 10 | 0 |
| data_194 | −4 | −1 | 5 | 10 | 0 |
| data_195 | −4 | 5 | −1 | 10 | 0 |
| data_196 | −3 | −2 | 5 | 10 | 0 |
| data_197 | −3 | 5 | −2 | 10 | 0 |
| data_198 | −2 | −3 | 5 | 10 | 0 |
| data_199 | −2 | 5 | −3 | 10 | 0 |
| data_200 | −1 | −4 | 5 | 10 | 0 |
| data_201 | −1 | 5 | −4 | 10 | 0 |
| data_202 | 0 | −5 | 5 | 10 | 0 |
| data_203 | 0 | 5 | −5 | 10 | 0 |
| data_204 | 1 | −5 | 4 | 10 | 0 |
| data_205 | 1 | 4 | −5 | 10 | 0 |
| data_206 | 2 | −5 | 3 | 10 | 0 |
| data_207 | 2 | 3 | −5 | 10 | 0 |
| data_208 | 3 | −5 | 2 | 10 | 0 |
| data_209 | 3 | 2 | −5 | 10 | 0 |
| data_210 | 4 | −5 | 1 | 10 | 0 |
| data_211 | 4 | 1 | −5 | 10 | 0 |
| data_212 | 5 | −5 | 0 | 10 | 0 |
| data_213 | 5 | −4 | −1 | 10 | 0 |
| data_214 | 5 | −3 | −2 | 10 | 0 |
| data_215 | 5 | −2 | −3 | 10 | 0 |
| data_216 | 5 | −1 | −4 | 10 | 0 |
| data_217 | 5 | 0 | −5 | 10 | 0 |
| data_218 | −4 | 1 | 5 | 10 | 2 |
| data_219 | −4 | 2 | 4 | 10 | 2 |

TABLE 2-continued

| Value | Symbol Block | | | Energy | Weight |
|---|---|---|---|---|---|
| | UA | UB | UC | | |
| data_220 | −4 | 3 | 3 | 10 | 2 |
| data_221 | −4 | 4 | 2 | 10 | 2 |
| data_222 | −4 | 5 | 1 | 10 | 2 |
| data_223 | 1 | −4 | 5 | 10 | 2 |
| data_224 | 1 | 5 | −4 | 10 | 2 |
| data_225 | 2 | −4 | 4 | 10 | 2 |
| data_226 | 2 | 4 | −4 | 10 | 2 |
| data_227 | 3 | −4 | 3 | 10 | 2 |
| data_228 | 3 | 3 | −4 | 10 | 2 |
| data_229 | 4 | −4 | 2 | 10 | 2 |
| data_230 | 4 | 2 | −4 | 10 | 2 |
| data_231 | 5 | −4 | 1 | 10 | 2 |
| data_232 | 5 | 1 | −4 | 10 | 2 |
| data_233 | −5 | 1 | 5 | 11 | 1 |
| data_234 | −5 | 2 | 4 | 11 | 1 |
| data_235 | −5 | 3 | 3 | 11 | 1 |
| data_236 | −5 | 4 | 2 | 11 | 1 |
| data_237 | −5 | 5 | 1 | 11 | 1 |
| data_238 | 1 | −5 | 5 | 11 | 1 |
| data_239 | 1 | 5 | −5 | 11 | 1 |
| data_240 | 2 | −5 | 4 | 11 | 1 |
| data_241 | 2 | 4 | −5 | 11 | 1 |
| data_242 | 3 | −5 | 3 | 11 | 1 |
| data_243 | 3 | 3 | −5 | 11 | 1 |
| data_244 | 4 | −5 | 2 | 11 | 1 |
| data_245 | 4 | 2 | −5 | 11 | 1 |
| data_246 | 5 | −5 | 1 | 11 | 1 |
| data_247 | 5 | 1 | −5 | 11 | 1 |
| data_248 | −5 | 2 | 5 | 12 | 2 |
| data_249 | −5 | 3 | 4 | 12 | 2 |
| data_250 | −5 | 4 | 3 | 12 | 2 |
| data_251 | −5 | 5 | 2 | 12 | 2 |
| data_252 | 2 | −5 | 5 | 12 | 2 |
| data_253 | 2 | 5 | −5 | 12 | 2 |
| data_254 | 3 | −5 | 4 | 12 | 2 |
| data_255 | 3 | 4 | −5 | 12 | 2 |
| control_0 | 4 | −5 | 3 | 12 | 2 |
| control_1 | 4 | 3 | −5 | 12 | 2 |
| control_2 | 5 | −5 | 2 | 12 | 2 |
| control_3 | 5 | 2 | −5 | 12 | 2 |
| BIT | 2 | 0 | 0 | 2 | 2 |

Each entry in Table 2 comprises four parts: the value of the data/control/BIT word in decimal; the values of the three undenary (base-eleven) symbols (UA, UB, and UC) which together form the symbol triplet for that data/control/BIT word; the 'Energy' of that encoded value, and the 'Weight' (DC residual) associated with that encoded value. The energy is derived for each encoded value by summing the absolute (unsigned) values of the individual undenary symbols making up that encoded value. The DC residual is derived for each encoded value by summing the signed values of the individual undenary symbols making up that encoded value. Thus, the undenary code word for the data word having decimal value 179 (data_179) is the triplet of symbols (3, −4, 2), and the associated energy and weight (DC residual) are 9 and 1, respectively.

The weight is significant in relation to the desirability of maintaining DC balance on a twisted-pair conductor, to avoid sustained presence of voltage offsets on the conductor. The presence of such offsets for extended periods causes difficulties in systems using transformer coupling and must therefore be avoided. The weight for each encoded value is used to keep such offsets within predetermined limits.

Table 2 was constructed as follows. First, all 3-digit base-11 numbers are listed in a spreadsheet. Next, they are converted into voltage level triplets where '−5' corresponds to digit '0', '−4' corresponds to digit '1', etc. The DC residual is calculated by summing each value of the voltage level triplet. The voltage level triplets are then sorted by DC residual. Triplets having a DC residual with a magnitude greater than two (>2) are eliminated. Note that the negative residuals are not separately listed in Table 2, but are dependent upon the present value of a running digital sum (RDS).

The triplet symbol energy is computed by summing the absolute values of each voltage level triplet. The following seven low energy symbols that do not have a zero crossing: (0,0,0), (0,0,1), (0,1,0), (1,0,0), (0,1,1), (1,0,1), and (1,1,0) are also eliminated from Table 2.

Advantageously, this leaves exactly two hundred sixty one (261) remaining symbols, where one hundred seven one (171) have two variants and ninety (90) have a single variant. Finally, reserve a built-in-test (BIT) symbol that aligns with the pixel frame (first variant is: 2,0,0), and is therefore reserved for that purpose.

The remaining symbols are numbered in order with the lowest energy symbol corresponding to the lowest pixel intensity and with the control symbols following the data symbols. Higher energy symbols will create more undesirable electromagnetic interference than lower level symbols as taught in Deloit (U.S. Pat. No. 6,052,390) at column 12, lines 32-48.

The 8/2/1B:3U encoder 21 contains a counter which maintains a running digital sum (RDS) of the weights of all transmitted code words. As each successive data/control/BIT word is encoded, its associated weight as listed in Table 2 (and whether its weight is greater than zero or not) is compared with this cumulative sum. If the cumulative sum is positive and the weight of the code word is nonzero, the code word (and thus its weight) is inverted. For example, the code word for the data word having decimal value 179 (data_179) would in this case become the triplet (−3, 4, −2), with a weight of −1.

An advantageous property of the code defined by Table 2 is that the weight of any code word is constrained to be less than or equal to two (2). This constraint on code word weight further assists in minimizing voltage offsets on the conductor.

FIG. 3 shows waveforms which would appear when the data word having a value of 179 (data_179) is transmitted over the traditional TMDS physical layer 31 and the inventive undenary physical layer 33 of the present invention. As a reference, the clock signal 32 used with the present invention is the same as that used in the TMDS physical layer. FIG. 3 clearly shows the lower symbol clock of the present invention (e.g. 3× the pixel clock) as compared with the TMDS data symbol clock (e.g. 10× the pixel clock).

The encoder 21 and decoder 27 may be implemented, for example, using look-up tables held in read-only memory or using digital logic circuitry. Alternatively they may be implemented using stored program instructions to control the operation of a processor to derive the required values from logical formulae defining the required properties of the encoding.

FIG. 4 illustrates the encoding method, for an 8/2/1B:3U encoder, in accordance with the present invention. First, the TMDS input set is read (step 41) into the encoder, where this input set includes: a TMDS "Data Enable" signal, two TMDS control signals, "[C1:C0]", and eight TMDS data signals, "[D7:D0]". Next, if the BIT signal is not set (e.g. logic '0') then the input set is encoded (step 42) into a data block of three undenary (base-11) symbols, selected from a predetermined group of allowable data blocks in accordance with a code, such as that listed in Table 2. Finally, the data block of three undenary (base-11) symbols is output (step 43) as a sequence of analog voltage levels that are synchronized with the TMDS pixel clock 100 (shown in FIG. 2). When the BIT signal is set (e.g. logic '1'), then a special data block of three undenary (base-11) symbols is selected (step 44) and output (step 43) as a sequence of analog voltage levels that are synchronized with the TMDS pixel clock 100 (shown in FIG. 2).

FIG. 5 illustrates the decoding method, for a 3U:8/2/1B decoder, in accordance with the present invention. First, a sequence of analog voltage levels, that are synchronized with the TMDS pixel clock 100 (shown in FIG. 2) and represent a data block of three undenary symbols, is accepted as an input (step 51). Next, the data block of three undenary (base-11) symbols is decoded (step 52), in accordance with a code such as that shown in Table 2, into a BIT output signal and a TMDS output set consisting of a TMDS "Data Enable" signal, two TMDS control signals, "[C1:C0]", and eight TMDS data signals, "[D7:D0]". Finally, the TMDS output set is written out (step 53). When the BIT data block is decoded, a BIT signal is written out (step 54).

It will be obvious to a person skilled in the art, given the encodings defined by Table 2, that additional encodings having the same properties may be derived therefrom by simple invariance transformations. For example, an alternate encoding table can be created using the same set of 'values' and the same set of 'symbol blocks' as in Table 2, but where this alternate table has one-to-one matching between the 'values' and the 'symbol blocks' that differs from Table 2.

Finally refer to FIG. 6 which depicts a digital video interface in accordance with one illustrative embodiment of the present invention and summarizes the above description. As illustrated, a video source 61 is transmitting a single color pixel having an RGB value (0, 127, 255), which corresponds to a 'dark sky blue' color to a video sink 62. The RGB pixel value is transmitted as three groups of three multilevel symbols per group. A pixel clock signal 601, running at one-third the symbol rate, is transferred as a bi-level digital voltage between the undenary transmitter 64 and the undenary receiver 65, such as by using a Cat-5e unshielded twisted wire pair.

The Red video value for the dark sky blue pixel is '0', which corresponds to the undenary symbol triplet (−1, 0, 1) according to Table 2. The first red-value multilevel symbol 611 ($R_{UA}$), the second red-value multilevel symbol 612 ($R_{UB}$), and the third red-value multilevel symbol 613 ($R_{UC}$), are transferred as a varying-level analog voltage between the undenary transmitter 64 and the undenary receiver 65, such as by using a Cat-5e unshielded twisted wire pair.

The Green video value for the dark sky blue pixel is '127', which corresponds to the undenary symbol triplet (1, 3, −4) according to Table 2. The first green-value multilevel symbol 621 ($G_{UA}$), the second green-value multilevel symbol 622 ($G_{UB}$), and the third green-value multilevel symbol 623 ($G_{UC}$), are transferred as a varying-level analog voltage between the undenary transmitter 64 and the undenary receiver 65, such as by using a Cat-5e unshielded twisted wire pair.

The Blue video value for the dark sky blue pixel is '255', which corresponds to the undenary symbol triplet (3, 4, −5) according to Table 2. The first blue-value multilevel symbol 631 ($B_{UA}$), the second blue-value multilevel symbol 632 ($B_{UB}$), and the third blue-value multilevel symbol 633 ($B_{UC}$), are transferred as a varying-level analog voltage between the undenary transmitter 64 and the undenary receiver 65, such as by using a Cat-5e unshielded twisted wire pair.

In one embodiment, the video source 61 provides the same input data set that is used in a traditional TMDS interface to the undenary transmitter 64. In this embodiment, the undenary receiver provides the same output data set to the video sink 62 as a traditional TMDS interface. Advantageously, the digital video can be built as a pin-compatible replacement for interfaces that are presently available and is compatible with high definition content protection (HDCP).

INDUSTRIAL APPLICABILITY

To solve the aforementioned problems, the present invention is a unique system that allows for extending high-definition television cables by transmitting serial multi-level pixel data at a lower symbol rate than required for a bi-level (binary) symbol.

LIST OF ACRONYMS USED IN THE DETAILED DESCRIPTION OF THE INVENTION

The following is a list of the acronyms used in the specification in alphabetical order.
ADC analog to digital converter
B blue
BIT built-in-test
C clock (frequency)
C1:C0 two control bits (C1 is most significant)
d data (value)
DAC digital to analog converter
DC direct current
DE data enable (TMDS signal)
DVI digital visual interface
D7:D0 eight bits of data (D7 is most significant)
EMI electromagnetic interference
G green
Gbps gigabit per second
GHz gigahertz
HDCP high definition content protection
HDMI high definition multimedia interface
MHz megahertz
PAM pulse amplitude modulation
PAM-4 four-level pulse amplitude modulation
PAM-5 five-level pulse amplitude modulation
PAM-11 eleven-level pulse amplitude modulation
R red
RDS running digital sum
RGB red-green-blue (video data)
TMDS transition minimized differential signaling
UA base-eleven symbol (most significant symbol in the group ABC)
UB base-eleven symbol (middle symbol in the group ABC)
UC base-eleven symbol (least significant symbol in the group ABC)
UTP unshielded twisted pairs
3U:8/2/1B three-symbol undenary (base-eleven) to eight-symbol, alternatively two-symbol, and alternatively one-symbol binary (base-two)
8/2B:10B eight-symbol, alternatively two-symbol, binary (base-two) to ten-symbol binary (base-two)
8/2/1B:3U eight-symbol, alternatively two-symbol, and alternatively one-symbol binary (base-two) to three-symbol undenary (base-eleven)
10B:8/2B ten-symbol binary (base-two) to eight-symbol, alternatively two-symbol, binary (base-two)

Alternate Embodiments

Alternate embodiments may be devised without departing from the spirit or the scope of the invention. For example, a sixteen level symbol could be used to represent the eleven level data code shown herein to take advantage of commercially available flash 4-bit analog to digital converters as well as to allow for tuning energy and DC residual levels.

What is claimed is:

1. A system comprising:
   (a) a clock channel configured to transmit a clock signal at a predetermined rate; and
   (b) at least one data channel configured to transmit data as a sequence of blocks of multi-level symbols being sent at a fixed multiple of the clock rate;
   (c) wherein each block of multi-level symbols comprises a sequence of at least three multi-level symbols;
   (d) wherein each multi-level symbol has an analog voltage level selected from a predetermined number of possible values, the predetermined number being an odd integer greater than two;
   (e) wherein the fixed multiple of the clock rate is an integer greater than one; and
   (f) wherein each block of multi-level symbols conforms to the code defined in Table 2.

2. The system of claim 1, wherein each data channel further includes:
   (a) an encoder for deriving a code block for each of a plurality of signals in accordance with a predetermined code;
   (b) a digital to analog converter adapted to accept the code block from the encoder and to generate, as an output, a group of multi-level symbols corresponding thereto;
   (c) transmission media coupled to the digital to analog converter for transmitting the group of multi-level symbols over the at least one data channel;
   (d) an analog to digital converter coupled to the transmission media and adapted to accept, as an input, the group of multi-level symbols and to generate the code block corresponding thereto; and
   (e) a decoder adapted to accept the code block from the analog to digital converter and to derive each of the plurality of signals from the code block in accordance with the predetermined code.

3. The system of claim 2, wherein the transmission media comprises:
   (a) a twisted pair of wires;
   (b) a first transformer coupling the output of the digital to analog converter to the twisted pair of wires; and
   (c) a second transformer coupling the twisted pair of wires to the input of the analog to digital converter.

4. The system of claim 2, wherein the transmission media comprises:
   (a) a pre-emphasis stage; and
   (b) an equalization stage.

5. The system of claim 1, wherein a number of symbols in each block of multi-level symbols is equal to the fixed multiple of the clock rate.

6. The system of claim 1, wherein each multi-level symbol has an analog voltage level selected from eleven possible values.

7. A method comprising the steps of:
   (a) transmitting a clock signal at a predetermined rate; and
   (b) transmitting data as a sequence of blocks of multi-level symbols at a fixed multiple of the clock rate;
   (c) wherein each block of multi-level symbols comprises a sequence of at least three multi-level symbols;
   (d) wherein each multi-level symbol has an analog voltage level selected from a predetermined number of possible values, the predetermined number being an odd integer greater than two;
   (e) wherein the fixed multiple of the clock rate is an integer greater than one; and
   (f) wherein each block of multi-level symbols to the code defined in Table 2.

8. The system of claim 7, wherein each multi-level symbol has an analog voltage level selected from eleven possible values.

9. A method comprising the steps of:
   (a) deriving a code block for each of a plurality of signals in accordance with a predetermined code by an encoder;
   (b) accepting the code block from the encoder and generating, as an output, a group of multi-level symbols corresponding thereto by a digital to analog converter;
   (c) transmitting the group of multi-level symbols over at least one data channel;
   (d) accepting, as an input, the group of multi-level symbols and generating the code block corresponding thereto by an analog to digital converter; and
   (e) accepting the code block from the analog to digital converter and deriving each of the plurality of signals from the code block in accordance with the predetermined code by a decoder;
   (f) wherein each multi-level symbol has an analog voltage level selected from a predetermined number of possible values, the predetermined number being an odd integer greater than two; and
   (g) wherein the code block is encoded using the code defined in Table 2.

10. The method of claim 9 further comprising the steps of:
    (a) determining whether a built-in-test (BIT) signal is present; and
    when the BIT signal is present,
    (b) selecting a data block of multi-level symbols corresponding to the BIT signal.

11. The method of claim 9, wherein the plurality of signals comprises data and control signals normally associated with a transition minimized differential signaling (TMDS) physical layer.

12. The system of claim 10, wherein each multi-level symbol has an analog voltage level selected from eleven possible values.

13. A method for transmitting data and control signals on twisted wire pairs, the method comprising:
    (a) providing a clock channel operating at a predetermined rate and transmitting a clock signal on a first one of the twisted wire pairs;
    (b) providing at least one data channel, each operating at a same fixed multiple of the clock rate; and
    (c) wherein each of the at least one data channel includes:
    (i) an encoder performing the steps of:
    (A) accepting, as an input set, a transition minimized differential signaling (TMDS) "Data Enable" signal, two TMDS control signals, "[C1:C0]", and eight TMDS data signals, "[D7:D0]",
    (B) producing, as an output set, a first sequence of three undenary symbols, and
    (C) computing a running digital sum of the undenary symbols of the first sequence,
    (ii) a digital to analog converter for accepting the first sequence of three undenary symbols and producing therefrom an output varying level analog voltage in synchronization with the clock channel,
    (iii) a pre-emphasis stage for conditioning and transmitting the varying level analog voltage onto a corresponding further one of the twisted wire pairs,
    (iv) an equalization stage for receiving and conditioning the varying level analog voltage from the corresponding further one of the twisted wire pairs, (v) an analog to digital converter for accepting the varying level analog voltage and producing therefrom a second sequence of three undenary symbols in synchronization with the clock channel,
(vi) a decoder performing the steps of:
(A) accepting, as an input set, the second sequence of three undenary symbols, and
(B) producing, as an output set, a TMDS "Data Enable" signal, two TMDS control signals, "[CI:C0]", and eight TMDS data signals, "[D7:D0]".

14. The method of claim 13, wherein the clock channel and each of the at least one data channel use transformer coupling to connect to its corresponding wire pair.

15. The method of claim 13, further comprising:
(a) accepting as an input, a built-in-test signal and producing therefrom, as an output set, a predetermined sequence of three undenary symbols by the encoder; and
(b) recognizing the predetermined sequence of three undenary symbols corresponding to the built-in-test signal and producing therefrom a built-in-test signal output by the decoder.

16. The method of claim 13, further comprising:
(a) encoding the first sequence of three undenary symbols in accordance with the code defined in Table 2 herein; and
(b) decoding the second sequence of three undenary symbols in accordance with the code defined in Table 2 herein.

17. The method of claim 13, wherein the same fixed multiple of the clock rate is three times the clock rate.

18. The method of claim 13, wherein voltage levels corresponding to specific undenary symbols, as produced by the digital to analog converter, are dynamically adjusted for a particular wiring installation.

19. The method of claim 13, wherein the digital to analog converter and the analog to digital converter each have a resolution of greater than 4-bits.

* * * * *